United States Patent
Buchanan et al.

(10) Patent No.: US 10,418,103 B1
(45) Date of Patent: Sep. 17, 2019

(54) TCAM-DRIVEN RRAM

(71) Applicant: HEWLETT PACKARD ENTERPRISE DEVELOPMENT LP, Houston, TX (US)

(72) Inventors: Brent Buchanan, Fort Collins, CO (US); John Paul Strachan, San Carlos, CA (US); Le Zheng, Palo Alto, CA (US); Catherine Graves, Palo Alto, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/958,903

(22) Filed: Apr. 20, 2018

(51) Int. Cl.
  *G11C 15/00* (2006.01)
  *G11C 15/04* (2006.01)
  *G11C 13/00* (2006.01)
  *G11C 7/06* (2006.01)

(52) U.S. Cl.
  CPC .............. *G11C 15/046* (2013.01); *G11C 7/06* (2013.01); *G11C 13/0026* (2013.01)

(58) Field of Classification Search
  CPC ...... G11C 15/046; G11C 7/06; G11C 13/0026
  USPC ......................................................... 365/49.1
  See application file for complete search history.

(56) References Cited

U.S. PATENT DOCUMENTS

| | | | |
|---|---|---|---|
| 9,502,114 B1 | 11/2016 | Lin et al. | |
| 9,847,132 B1* | 12/2017 | Zheng | G11C 15/046 |
| 2013/0054886 A1 | 2/2013 | Eshraghian et al. | |
| 2015/0206586 A1* | 7/2015 | Chang | G11C 15/046 |
| | | | 365/49.17 |
| 2017/0062052 A1* | 3/2017 | Roy | G11C 15/046 |

OTHER PUBLICATIONS

Eshraghian, K. et al., "Memristor MOS Content Addressable Memory (MCAM): Hybrid Architecture for Future High Performance Search Engines", May 11, 2010, 10 pages. https://arxiv.org/pdf/1005.3687.pdf.

Imani, M. et al., "Resistive Configurable Associative Memory for Approximate Computing", Mar. 14, 2016, 6 pages. http://people.eecs.berkeley.edu/~abbas/papers/DATE16_ReCAM.pdf.

JP Infotech, "Energy-efficient TCAM Search Engine Design Using Priority-decision in Memory Technology", Oct. 24, 2017, 5 pages. http://www.jpinfotech.org/energy-efficient-tcam-search-engine-design-using-priority-decision-memory-technology.

Zheng, L. et al., "RRAM-Based TCAMs for Pattern Search", Aug. 11, 2016, 4 pages. http://ieeexplore.ieee.org/abstract/document/7527507.

* cited by examiner

*Primary Examiner* — Vu A Le
(74) *Attorney, Agent, or Firm* — Mannava & Kang, P.C.

(57) ABSTRACT

According to examples, an apparatus may include a ternary content addressable memory (TCAM) including a plurality of TCAM bit cells connected in a row along a match line. Each of the TCAM bit cells may store a bit of a TCAM word and the TCAM bit cells may drive a digital signal over the match line in response to a search word matching the TCAM word. The apparatus may include a resistive random-access memory (RRAM) comprising a row of RRAM bit cells connected to the TCAM via the match line. Each of the RRAM bit cells may store a bit of a RRAM word. The RRAM bit cells may output the RRAM word in response to the TCAM bit cells driving the digital signal over the match line.

20 Claims, 6 Drawing Sheets

US 10,418,103 B1

TCAM-DRIVEN RRAM

BACKGROUND

Content addressable memory is a type of memory that may perform a search operation using an input data string as search content and outputting an address of a location in the memory that stores matching data (if any). Ternary content addressable memory (TCAM) is a type of content addressable memory that has bit cells that store a wildcard data value in addition to two binary values. When a bit cell that stores the wildcard data value is searched, the result may be a match regardless of what search criterion is used to search the bit cell. Some TCAMs may also allow a search to be conducted on the basis of a wildcard search criterion. When a bit cell is searched based on the wildcard search criterion, the result may be a match regardless of what value is stored in the bit cell.

BRIEF DESCRIPTION OF THE DRAWINGS

Features of the present disclosure are illustrated by way of example and not limited in the following figure(s), in which like numerals indicate like elements, in which.

DETAILED DESCRIPTION

Figure 1A:
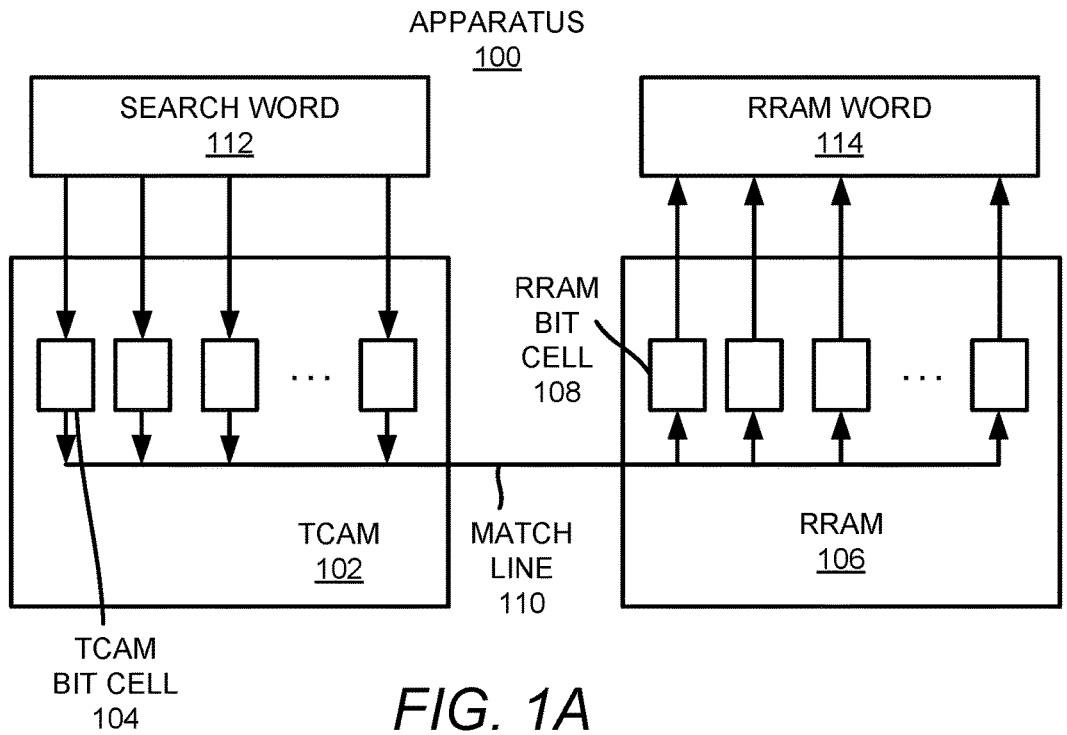
FIG. 1A shows a block diagram of an example apparatus that may include a ternary content addressable memory (TCAM) that may drive a resistive random-access memory RRAM to output an RRAM word.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

Disclosed herein are apparatuses that may include a ternary content addressable memory (TCAM) that may drive a digital signal over a match line to a resistive random-access memory (RRAM) to drive the RRAM to output an RRAM word. The TCAM may include a plurality of TCAM bit cells that each stores a bit of a TCAM word and that are each connected to the match line. When a search word is applied to the TCAM, the match line may be pre-charged with a high voltage signal and may be allowed to float. In instances in which any of the bits of the search word do not match the bits of the TCAM word, the high voltage signal may be pulled low. However, in instances in which the bits of the search word match the bits of the TCAM word, the signal across the match line may remain high. The high voltage signal may cause an RRAM word stored in RRAM bit cells of the RRAM to be outputted, for instance, to an output bus.

According to examples, therefore, the signal applied across the match line may be a digital signal, e.g., either a high voltage signal or a low voltage (or no) signal. In addition, the TCAM may apply the digital signal directly to the RRAM through the match line. In other words, the signal may not be converted prior to being applied by the TCAM in order to activate the RRAM bit cells. In one regard, as the TCAM may directly drive the RRAM, the TCAM word search and the RRAM word output may be performed in a single operation. That is the search output may occur in the same operation as the search input regardless of a number of TCAM bit cells being used for a search word.

According to examples, the apparatuses disclosed herein may include a plurality of TCAMs connected to a plurality of RRAMs via a plurality of respective match lines. Each of the TCAMs may store a TCAM word and may drive a respective RRAM to output an RRAM word in response to a search word matching the TCAM word stored in the TCAM. In some examples, the TCAM words may correspond to words used for regular expression (regex) matching, which may be used for deep packet inspection in network devices. For instance, the apparatuses disclosed herein may perform deep packet inspection to search for malicious code or suspicious data streams in real time. That is, a search hit in a particular TCAM may cause a corresponding RRAM word to be output.

According to examples, a multiple match resolver may be interposed between the plurality of TCAMs and the plurality of RRAMs and may be used for regex matching, IP lookup routing tables, etc. Generally speaking, use of TCAMs for these applications may enable the use of a wildcard such that the data to be stored may be compressed (e.g., two rows differing by one bit may be combined into one although the degree of compression may typically be much greater). However, this compression means that multiple hits may occur in the TCAMs. In commercial TCAMs, a priority encoder, which may be a multiple match resolver plus an address encoder, may handle the multiple hits and may output a single address. In the apparatuses disclosed herein, as the TCAMs directly drive the RRAMS, a multiple match resolver may be employed without the address encoder, which may simplify the apparatuses.

According to examples, each of the RRAMs may include an additional RRAM bit cell that may not store a bit of an RRAM word. Instead, the additional RRAM bit cells may be implemented to validate an outputted search word. For example, there may be instances in which some of the TCAM words are not unique with respect to the other TCAM words and thus, a search word may match multiple ones of the TCAM words stored in the TCAMs. In these instances, multiple ones of the RRAMs may output RRAM words and thus, an erroneous RRAM word may be outputted. As discussed herein, the additional RRAM bit cells of the RRAMs that output the search words may also be activated such that a detectable current may flow through those additional RRAM bit cells. The number of RRAM words that are outputted may be determined by determining the number of the additional RRAM bit cells that have become active. In this regard, a determination may be made that a single RRAM word was outputted, in which case the output may be deemed to be valid. Alternatively, a determination may be made that multiple RRAM words were outputted, in which case the outputs may be deemed to be invalid.

Figure 1B:
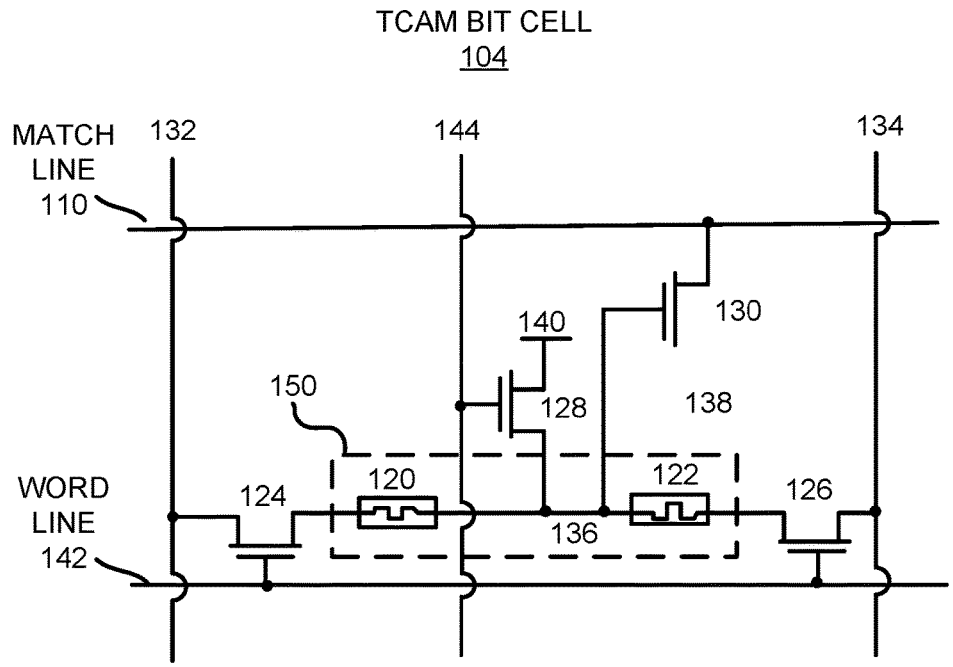
FIG. 1B shows a circuit diagram of an example bit cell of the TCAM depicted in FIG. 1A.

Reference is first made to FIGS. 1A and 1B. FIG. 1A shows a block diagram of an example apparatus 100 that may include a ternary content addressable memory (TCAM) 102 that may drive a resistive random-access memory (RRAM) 106 to output an RRAM word 114. FIG. 1B shows a circuit diagram of an example bit cell 104 of the TCAM 102 depicted in FIG. 1A. It should be understood that the apparatus 100 and the TCAM bit cell 104 may include additional components and that some of the components described herein may be removed and/or modified without departing from a scope of the apparatus 100 or the TCAM bit cell 104 disclosed herein. Additionally, it should be understood that the TCAM 102 may include bit cells having configurations other than the configuration shown in the TCAM bit cell 104 depicted in FIG. 1B without departing from a scope of the apparatus 100.

As shown in FIG. 1A, the TCAM 102 may include a plurality of TCAM bit cells 104 connected in a row (or an array) along a match line 110. Each of the TCAM bit cells 104 may store a bit of a TCAM word. A TCAM word may be a piece of data handled as a unit, for instance, by the instruction set or the hardware of a processor. The number of bits in a word, e.g., the word size, word width, or word length, may vary depending on the processor design or computer architecture. The TCAM word size may be any of 8, 16, 24, 32, or 64 bits, while other word sizes may be used. According to examples, the TCAM 102 may perform regular expression (RegEx) matching of search words 112 for deep packet inspection of packets. Particularly, the TCAM 102 may be used to search for malicious code or interesting code in the packets and in real time. In this regard, the TCAM bit cells 104 may be programmed to store the bits of a particular TCAM word that corresponds to a malicious code or an interesting code. For instance, RegEx matching with the TCAM 102 may be performed by creating a state-transition table that includes columns for the current state, input character and next state (e.g., a deterministic finite automata). In addition, the current state and input character columns of this table may be stored in the TCAM 102, and the next state column may be stored in the RRAM 106.

According to examples, when the search word 112 matches the TCAM word stored in the TCAM bit cells 104, a signal may be driven or maintained across the match line 110 to the RRAM 106. Particularly, the signal may be driven or maintained to a plurality of RRAM bit cells 108 in the RRAM 106. Each of the RRAM bit cells 108 may store a bit of an RRAM word 114. The RRAM word 114 may be a piece of data handled as a unit, for instance, by the instruction set or the hardware of a processor. The RRAM bit cells 108 may be arranged in a row and may be connected to the TCAM bit cells 104 via the match line 110. In addition, in response to receipt of the signal driven across the match line 110, each of the RRAM bit cells 108 may output a bit of the RRAM word 114. The bits outputted by the RRAM bit cells 108 may be combined to form the RRAM word 114.

According to examples, the TCAM bit cells 104 of the TCAM 102 may output or maintain a high voltage signal in response to the search word 112 matching the TCAM word stored in the TCAM bit cells 104. In addition, in response to receipt of the high voltage signal, the RRAM bit cells 108 may output bits of the RRAM word 114. In this regard, when the search word 112 matches a predefined word, such as a word corresponding to malicious code, interesting code, etc., the apparatus 100 may output an RRAM word 114 that indicates that a word corresponding to such a code has been detected. Various manners in which the TCAM 102 and the RRAM 106 may operate are described in further detail herein.

As shown in FIG. 1B, the TCAM bit cells 104 may include memristors 120 and/or 122 as storage elements. The use of memristors 120, 122 as storage elements in the TCAM bit cells 104 may allow the TCAM 102 to be a non-volatile memory device. In addition, as a result of using memristors 120, 122, the TCAM 102 may have higher storage densities and lower power consumption than comparable TCAMs that use SRAMs or DRAMs as storage elements.

In particular, each of the TCAM bit cells 104 may include a first memristor 120, a second memristor 122, a first switching transistor 124, a second switching transistor 126, a third switching transistor 128, and a match line transistor 130. The first switching transistor 124, the first memristor 120, the second memristor 122, and the second switching transistor 126 may be connected in series between a first data line 132 and a second data line 134. Thus, the first memristor 120 may be switchably connected to the first data line 132 via the first switching transistor 124, and the second memristor 122 may be switchably connected to the second data line 134 via the second switching transistor 126. The first memristor 120 and the second memristor 122 may be connected to each other via a common node, namely the node 136. The match line transistor 130 may be connected between a first rail 138 and the match line 110. The third switching transistor 128 may be connected between the node 136 and a second rail 140. Thus, the node 136 may be switchably connected to the second rail 140 via the third switching transistor 128.

Gates of the first and second switching transistors 120 and 122 may be connected to a word line 142, and therefore a voltage of the word line 142 may control conductive states of the first and second switching transistors 124 and 126. A gate of the third switching transistor 128 may be connected to a third data line 144, and therefore a voltage of the third data line 144 may control a conductive state of the third switching transistor 128. A gate of the match line transistor 130 may be connected to the node 136, and therefore a voltage of the node 136 may control a conductive state of the match line transistor 130.

The first and second memristors 120 and 122 may serve as the storage element of the TCAM bit cell 104. A memristor (such as the first and second memristors 120 and 122) may be a device whose resistance may be changed between multiple resistance states by applying certain voltage differences across the memristor or flowing certain currents through the memristor, with the device "remembering" or maintaining its most recent resistance state even when the voltage/current that caused the device to enter that state has been removed. In other words, the current resistance state of a memristor may depend on the magnitude and polarity of voltage differences that have been applied across the memristor in the past or on how much current has flowed in what direction through the memristor in the past.

In particular, the memristors 120 and 122 may each change between a low resistance state in which the memristor 120 and 122 exhibits relatively low resistance and a high resistance state in which memristor 120 and 122 exhibits relatively high resistance. For each of the memristors 120 and 122, the respective memristor may be caused to enter the low resistance state by applying a setting voltage difference of sufficient magnitude across the memristor with a certain polarity, and the respective memristor may be caused to change to the high resistance state by applying a resetting voltage difference of sufficient magnitude across the memristor with an opposite polarity.

The polarities with which the setting/resetting voltage differences may be applied to the memristors 120 or 122 in order to perform setting and resetting are indicated in FIG. 1B by a black band on one end of the symbol for the memristor 120 or 122. In particular, in order to set the memristor 120 or 122 to the low resistance state, the setting voltage difference may be applied across the memristor 120 or 122 such that a lower voltage is applied to the end of the memristor 120 or 122 that has the black band than is applied to the other end of the memristor 120 or 122. Conversely, in order to reset the memristor 120 or 122 to the high resistance state, the resetting voltage difference may be applied across the memristor 120 or 122, such that a higher voltage may be applied to the end of the memristor 120 or 122 that has the black band.

Once the memristor 120 or 122 is set or reset, the memristor 120 and 122 will tend to stay in its current resistance state until it is reset or set again. Moreover, the first and second memristors 120 and 122 in the TCAM bit cell 104 may be set or reset independently from one another. As a result, the combination of resistance states of the first and second memristors 120 and 122 may be used to store data values. For example, resistance states and stored values may be associated with one another. For instance, a first digital value (such as 0) may be stored by setting the first memristor 120 to the low resistance state and resetting the second memristor 122 to the high resistance state; a second digital value (such as 1) may be stored by resetting the first memristor 120 to the high resistance state and setting the second memristor 122 to the low resistance state; and a wildcard value may be stored by causing the first and second memristors 120 and 122 to have the same resistance state as one another (e.g., either both of the memristors 120 and 122 have the high resistance state or both have the low resistance state). Accordingly, for instance, the TCAM bit cells 104 may store three values including a wildcard value. That is, the TCAM bit cells 104 may be searched on the basis of three search criteria including a wildcard search criterion. Thus, the TCAM bit cells 104 may provide greater flexibility and speed in search operations.

In examples, the TCAM 102 may include control circuitry that searches the TCAM bit cells 104 based on a first search criterion (e.g., "0"), based on a second search criterion (e.g., "1"), and based on a wildcard search criterion. The control circuitry may search the TCAM bit cell 104 based on the first search criterion by pre-charging the match line 110, applying a first voltage to the first data line 132, and applying a ground voltage to the second data line 134. The control circuitry may search the TCAM bit cell 104 based on a second search criterion by pre-charging the match line 110, applying the ground voltage to the first data line 132, and applying the first voltage to the second data line 134. The control circuitry may search the TCAM bit cell 104 based on the wildcard search criterion by applying a ground voltage to both the first and second data lines 132 and 134.

The two memristors 120 and 122 of the TCAM bit cell 104 may form a resistive divider 150. An output voltage of the resistive divider 150 (e.g., the voltage of the common node 136 between the two memristors 120 and 122) may be applied to the gate of the match line transistor 130, and thus the output voltage of the resistive divider 150 may control whether the match line transistor 130 is on or off. The relative resistances of the two memristors 120 and 122 and the voltages that are applied to the TCAM bit cell 104 during a search operation may be set such that the output voltage of the resistive divider 150 during the search operation is an off-voltage (low voltage) when the memristors 120 and 122 store a value that matches the search criterion and an on-voltage (high voltage) when the memristors 120 and 122 store a value that matches the search criterion. When the search criterion is the wildcard search criterion, the output voltage of the resistive divider 150 is low regardless of what value is stored in the memristors 120 and 122.

If a TCAM bit cell 104 stores a value that does not match the search criterion, the voltage of the common node 136 during the search may become a voltage that turns on the match line transistor 130, thereby directly connecting the match line 110 to the rail 138 and resulting in a voltage of the match line 110 (which has been pre-charged) being pulled down below its pre-charged voltage. If the TCAM bit cell 104 stores a value matching the search criterion, then the voltage of the common node may become a voltage that keeps the match line transistor 130 off so that the voltage of the match line 110 is not pulled down (at least not by that TCAM bit cell 104). Thus, when at least one of the TCAM bit cells 104 does not match the search criterion, the voltage of the match line 110 may be pulled down below a pre-charged voltage level. However, when the TCAM bit cells 104 match the search criterion, the voltage of the match line 110 may remain at the pre-charged voltage level.

In one regard, therefore, the TCAM 102 may drive the voltage of the match line 110 to either be at the pre-charged voltage level or at a voltage level that is lower than the pre-charged voltage level depending upon whether there is a match between the search word 112 and the TCAM word stored in the TCAM bit cells 104. As a result, the TCAM 102 may drive either a high voltage signal (if there is a match) or a low voltage signal (if there is a miss). In addition, the TCAM 102 may drive the digital signal over the match line 110 directly to the RRAM bit cells 108. In other words, the apparatus 100 may not include a device positioned between the TCAM 102 and the RRAM 106 to convert and/or amplify an analog output signal to a digital output signal.

Figure 3:
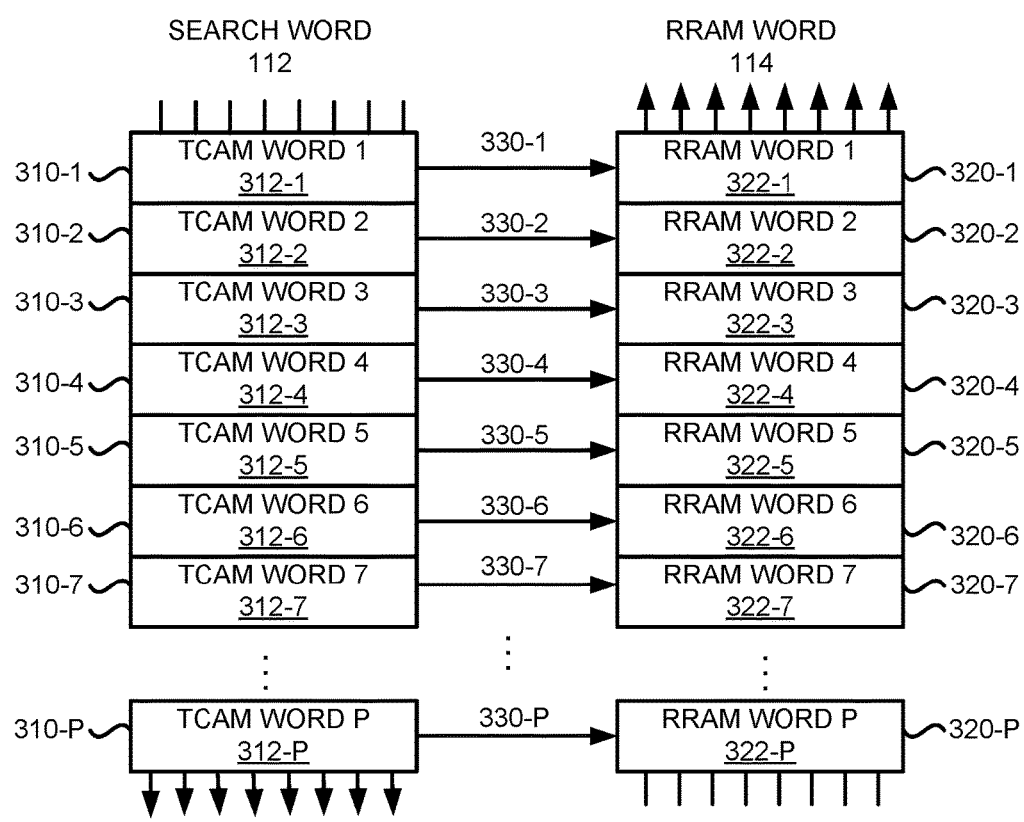
FIG. 3 shows a block diagram of an example apparatus that may cause an RRAM word of a plurality of RRAM words to be outputted based on match between a TCAM word and a search word.

The apparatus 100 may include multiple TCAMs 102 (as shown in FIG. 3), in which each of the TCAMs 102 may include multiple TCAM bit cells 104. The TCAMs 102 may be arranged in an array formed of rows and columns. In addition, the TCAM bit cells 104 in the TCAMs 102 may include the features shown in FIG. 1B. In examples, each first and second data line 132 and 134 may correspond to a column and may be connected to each TCAM bit cell 104 in their corresponding column, and each word line 142 may correspond to a row and be connected to each TCAM bit cell 104 in their corresponding row. Each match line 110 may correspond to a row and be connected to multiple TCAM bit cells 104 that are in their corresponding row, with the number of TCAM bit cells 104 per match line being equal to a search unit size for the TCAM (i.e., a word size) and the TCAM bit cells 104 that are connected to the same match line 104 as one another forming a word storage block. Each row may include a single word storage block (in which case there may be one-word line per row), or each row may include P>1 word storage blocks (in which case there may be P word lines per row). In an example, a high voltage signal may be supplied across each of the TCAM bit cells 104, which may cause a high voltage signal to be driven across the match line 110. In other words, the match line 110 may be pre-charged high prior to receipt of the search word 112. In an example, the bits of a search word 112, e.g., a word in a packet, may be inputted into the TCAM 102. The signal applied on the match line 110 may be pulled low in response to the bit of the search word 112 does not match the content of the corresponding TCAM bit cell 104. The TCAM bit cell 104 may store three values by changing resistance states of the two memristors 120 and 122. A first combination of resistance states of the two memristors 120 and 120 may correspond to a 0 value, a second combination of resistance states may correspond to a 1 value, and a third combination of resistance states may correspond to an X (wildcard) value.

Figure 2:
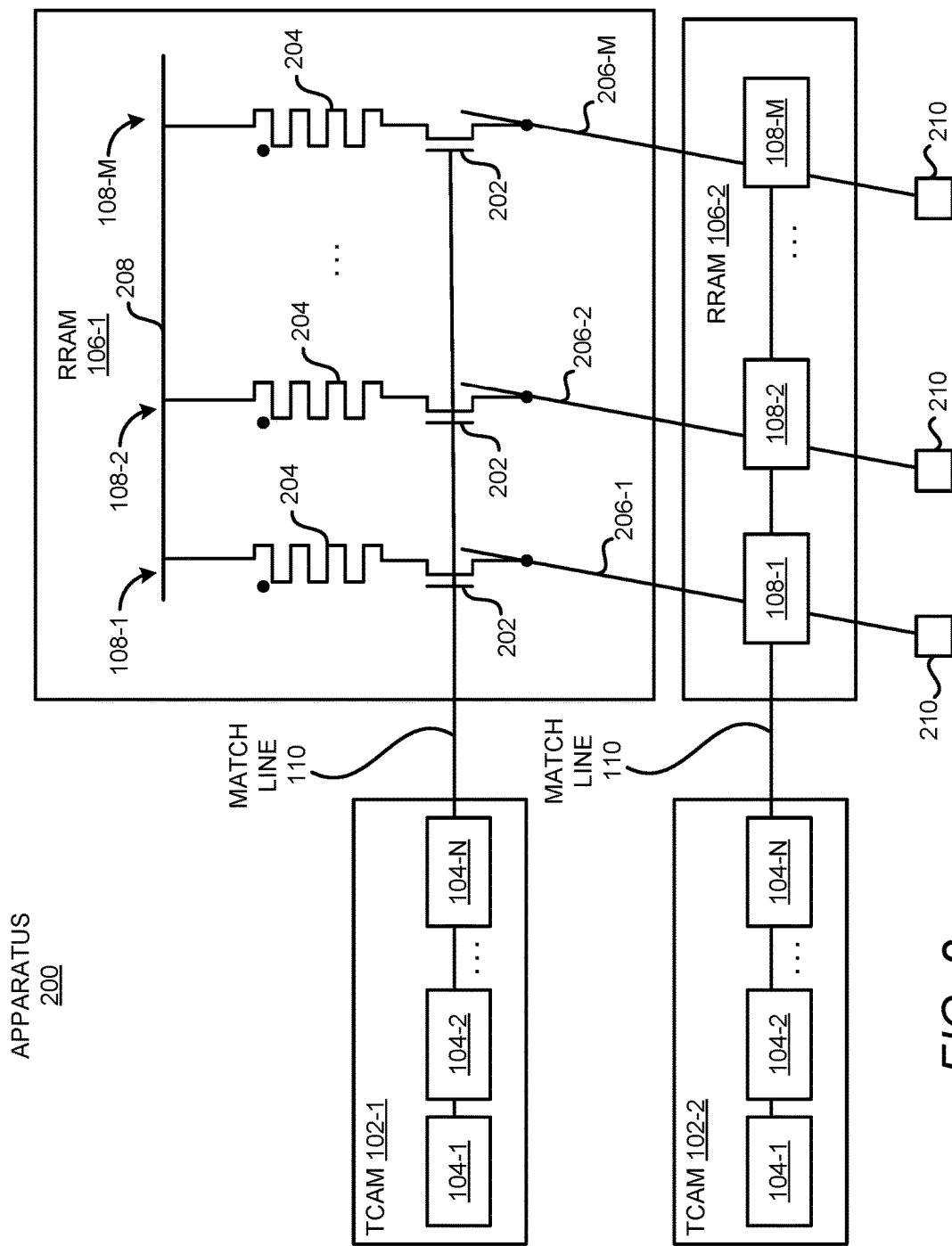
FIG. 2 shows a block diagram of an example apparatus that may include multiple TCAMs and multiple RRAMs.

Turning now to FIG. 2, there is shown a block diagram of an example apparatus 200 that may include multiple TCAMs 102 and multiple RRAMs 106. It should be understood that the apparatus 200 may include additional components and that some of the components described herein may be removed and/or modified without departing from a scope of the apparatus 200. For instance, although the apparatus 200 is depicted as including two TCAMs 102-1, 102-2 and two RRAMs 106-1, 106-2, it should be understood that the apparatus 200 may include any number of TCAMs 102 and RRAMs 106 without departing from a scope of the apparatus 200.

As shown in FIG. 2, the apparatus 200 may include a first TCAM 102-1 and a second TCAM 102-2, which may each be similar to the TCAM 102 depicted in FIGS. 1A and 1B. As such, each of the TCAMs 102-1 and 102-2 may include a row of TCAM bit cells 104-1 to 104-N, in which the variable "N" may represent a value greater than one. Each of the TCAM bit cells 104-1 to 104-N may be configured as shown in FIG. 1B. In addition, the first TCAM 102-1 may be connected to a first RRAM 106-1 and the second TCAM 102-2 may be connected to a second RRAM 106-2 via respective match lines 110. Each of the RRAMs 106-1 and 106-2 may be similar to the RRAM 106 depicted in FIG. 1A. The TCAM bit cells 104-1 to 104-N may drive or maintain a high voltage signal across a respective match line 110 when a search word 112 matches a TCAM word stored in the TCAM bit cells 104-1 to 104-N. The match lines 110 may also be connected to a plurality of RRAM bit cells 108-1 to 108-M in a respective RRAM 106-1, 106-2, in which the variable "M" may represent a value greater than one. The RRAM bit cells 108-1 to 108-M may be equivalent to the RRAM bit cells 108 depicted in FIG. 1A.

Each of the RRAM bit cells 108-1 to 108-M may include a transistor 202 connected to a resistor 204, e.g., each of the RRAM bit cells 108-1 to 108-M may be a 1T1R bit cell. The resistors 204 may each be a memristor or other non-volatile memory device, such as a phase change material. In any regard, each of the resistors 204 may be devices for which a state may change, e.g., may retain a most recent resistance state even when the voltage/current that caused the resistor 204 to enter that state has been removed. Each of the transistors 202 may be connected to a respective column line 206-1 to 206-M and each of the resistors 204 may be connected to a common top electrode 208. As shown in FIG. 2, the column lines 206-1 to 206-M may be connected to the RRAM bit cells 108-1 to 108-M in multiple RRAMs 106-1, 106-2. In addition, each of the column lines 206-1 to 206-M may be connected to a respective sense amplifier circuit 210 that may determine a total current flowing through a column line 206-1 to 206-M.

As discussed herein, the match lines 110 may be pre-charged to a high voltage level and may be allowed to float. When a miss occurs between a bit in the TCAM word and a bit in the search word 112 of a TCAM 102-1, 102-2, the match line 110 may be pulled to a low voltage level as discussed above with respect to FIG. 1B. In response to the low voltage level signal being applied across the match line 110, the transistors 202 connected to the match line 110 may remain in an off state in which current may not flow through the transistors 202 and thus through the resistors 204.

However, in response to matches occurring between the bits in the TCAM word and the bits in the search word 112 in a TCAM 102-1, a high voltage signal may remain on the match line 110. In response to the high voltage signal hitting the transistors 202 of the RRAM bit cells 108-1 to 108-M in the RRAM 106-1, the transistors 202 may be turned on, which may allow current to flow through the transistors 202 and through the resistors 204. That is, for instance, the transistors 202 may have a preset hit (e.g., open gate) voltage such that the transistors 202 may cause a current to be applied across the respective resistors 204 to which the transistors 202 are connected when the transistors 202 receive the high voltage signal. In other words, in response to receipt of the high signal voltage, the transistors 202 may cause a current to flow from the top electrode 208 to a respective column line 206-1 to 206-M through the resistors 204. In addition, the current flow on the respective column line 206-1 to 206-M may be provided to an output bus.

As the current flows from the top electrode 208 and through the resistors 204, the resistors 204 may vary the current levels depending upon the resistance levels of the resistors 204. For instance, each of the resistors 204 may be set to have one of a first resistance level or a second resistance level. Thus, a current flowing through a first resistor 204 that is set at the first resistance level may have a first current level at an output of the first resistor 204 and a current flowing through a second resistor 204 that is set at the second resistance level may have a second current level at an output of the second resistor 204. The first current level may correspond to a first bit "0" and the second current level may correspond to a second bit "1".

Each of the sense amplifier circuits 210 may detect the current levels of currents flowing through the respective column lines 206-1 to 206-M. That is, for instance, the sense amplifier circuits 210 may measure the total currents flowing through the respective column lines 206-1 to 206-M, which may depend upon the resistance levels of the resistors 204 in the RRAM bit cells 108-1 to 108-M in the RRAMs 106-1 and 106-2. The sense amplifier circuits 210 may each be a binary sense amplifier and may thus detect whether the signals flowing through a column line 206-1 to 206-M are high or low and may output a "1" or a "0" depending upon the detected current level. That is, the sense amplifier circuits 210 may resolve the current flow on the respective column lines 206-1 to 206-M into a "1" or "0".

Alternatively, the sense amplifier circuits 210 may each be a multi-level sense amplifier and thus may determine, from the total currents measured, a count of the RRAM bit cells 108-1 to 108-M in the RRAMs 106-1 to 106-M having a first current level "1". That is, a first sense amplifier 210 along the column line 206-1 may measure a total current along the column line 206-1, in which the total current may be based on the currents flowing through the first RRAM bit cells 108-1 in the first RRAM 106-1 and the second RRAM 106-2. For instance, the sense amplifier circuits 210 may resolve an input current into '0', '1', '2', etc., units of current (where one 'unit of current' is V/R along a column line 206-1 to 206-M, 'V' is the voltage on the top electrode 208, 'R' is the resistance of low-resistance state resistors in ohms, and the column lines 206-1 to 206-M may each be held at virtual ground by a respective sense amplifier circuit 210).

According to examples, the resistive levels of the resistors 204 in the RRAM bit cells 108-1 to 108-M may be set through the following operation. For the RRAM bit cells 108-1 to 108-M that are to be set to a low resistive state (LRS), the corresponding column lines 206-1 may be set low (all other column lines may be set high) and the top electrode 208 may be set to a set voltage. The match line 110 may be pulsed high and the current may flow through the resistors 204 with column lines that are set low and the current may be blocked from other resistors 204 by the gates of their respective transistors 202.

According to examples, the resistive levels of the resistors 204 in the RRAM bit cells 108-1 to 108-M may also be reset through the following operation. For bits to be reset to a high resistive state (HRS), the corresponding column lines may be set to a reset voltage (while all other column lines may be set low) and the top electrode 208 may be set low. In addition, the match line 110 may be pulsed high and the current may flow through the resistors with high column lines, while other resistors 204 will have no current flow even with all of the transistors 202 on because both their respective column line and the top electrode 208 are at the same low potential.

FIG. 3 shows a block diagram of an example apparatus 300 that may cause an RRAM word 114 of a plurality of RRAM words to be outputted based on a match of a TCAM word to a search word 112. It should be understood that the apparatus 300 depicted in FIG. 3 may include additional components and that some of the components described herein may be removed and/or modified without departing from a scope of the apparatus 300 disclosed herein.

As shown in FIG. 3, the apparatus 300 may include a plurality of TCAMs 310-1 to 310-P connected to a plurality of RRAMs 320-1 to 320-P via respective match lines 330-1 to 330-P. The variable "P" may represent a value greater than one. In addition, each of the TCAMs 310-1 to 310-P may be equivalent to the TCAM 102 depicted in FIGS. 1A, 1B, and 2 and each of the RRAMs 320-1 to 320-P may be equivalent to the RRAM 106 depicted in FIGS. 1A and 2. In this regard, each of the TCAMs 310-1 to 310-P may include a respective set of TCAM bit cells 104-1 to 104-N that may store a bit of a TCAM word 312-1 to 312-P. Each of the TCAMs 310-1 to 310-P may store a different TCAM word 312-1 to 312-P. In this regard, the TCAMs 310-1 to 310-P may be pre-filtered such that one TCAM word 312-1 to 312-P will match a search word 112. In other examples, however, multiple TCAM words 312-1 to 312-P may match the search word 112, for instance, when there is a wildcard value in the search word 112.

As also shown, each of the RRAMs 320-1 to 320-P may store a different RRAM word 322-1 to 322-P. As such, the RRAM word 322-1 to 322-P in the RRAM 320-1 to 320-P that is connected to the TCAM 310-1 to 310-P on which is stored the TCAM word 312-1 to 312-P that matches the search word 112 may be outputted as the RRAM word 114. That is, a search word 112 may be inputted into the TCAMs 310-1 to 310-P. In response to the search word 112 not matching any of the TCAM words 312-1 to 312-P, the search word 112 may not match any of the entries in the TCAM 310-1 to 310-P. In this instance, the pre-charged high voltage level on each of the match lines 330-1 to 330-P may be pulled low and thus, none of the RRAMs 320-1 to 320-P may output a RRAM word 322-1 to 322-P.

However, in response to the search word 112 matching a TCAM word, for instance, TCAM word 312-4, a high voltage signal may be maintained across the match line 330-4 to the RRAM 320-4. The signals across the other match lines 330-1 to 330-3 and 330-5 to 330-P may be pulled low. As a result, and as described herein, the RRAM 320-4 may output the RRAM word 322-4 as the outputted RRAM word 114.

Figure 4:
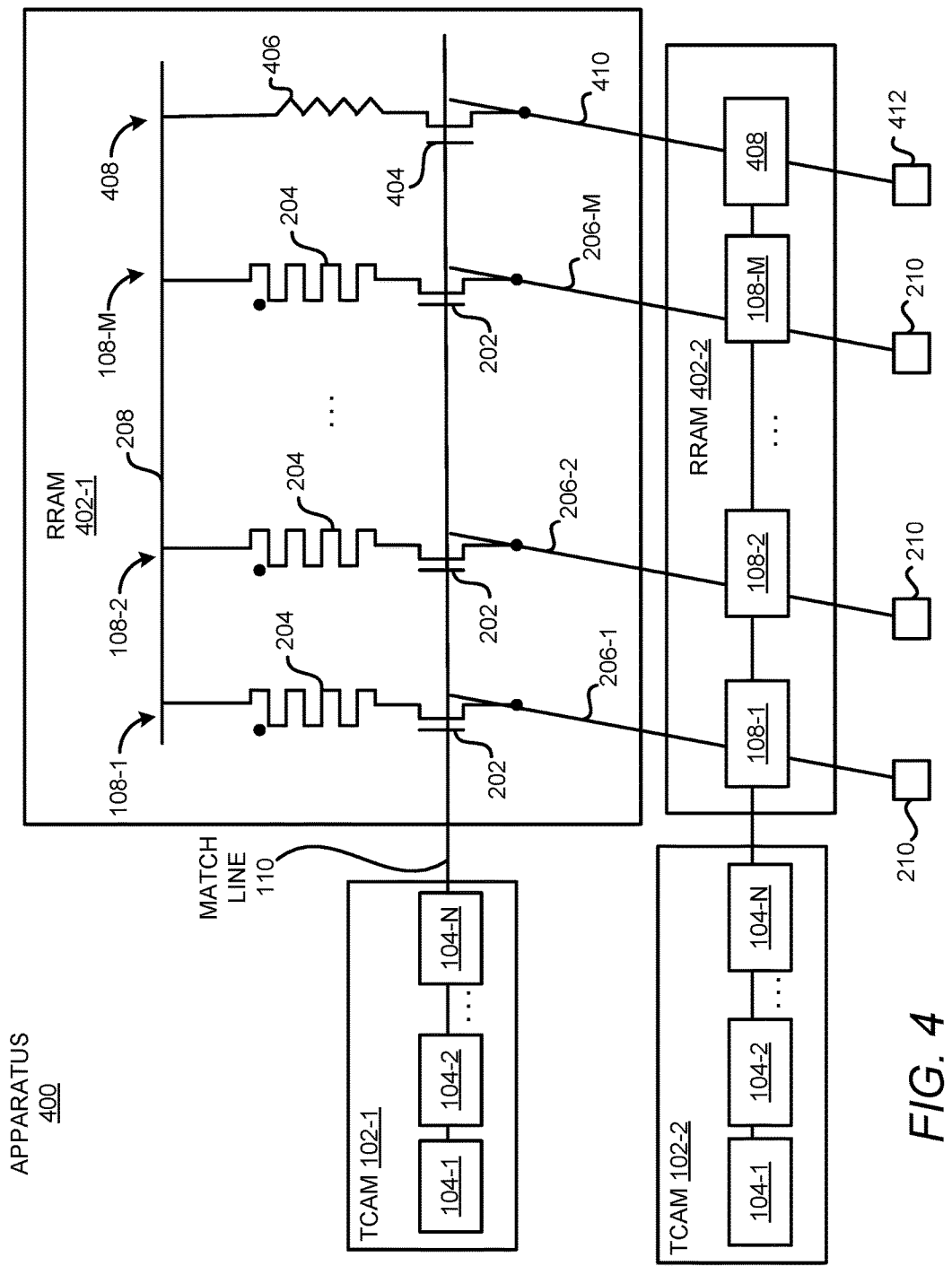
FIG. 4 shows a block diagram of an example apparatus that may include multiple TCAMs and multiple RRAMs, each of the multiple RRAMs having an additional RRAM bit cell.

Turning now to FIG. 4, there is shown a block diagram of an example apparatus 400 that may include multiple TCAMs 102 and multiple RRAMs 402, in which each of the RRAMs 402 may include an additional RRAM bit cell 408. It should be understood that the apparatus 400 may include additional components and that some of the components described herein may be removed and/or modified without departing from a scope of the apparatus 400. For instance, although the apparatus 400 is depicted as including two TCAMs 102-1, 102-2 and two RRAMs 402-1, 402-2, it should be understood that the apparatus 400 may include any number of TCAMs 102 and RRAMs 402 without departing from a scope of the apparatus 400.

As shown in FIG. 4, the apparatus 400 may include the same components as in the apparatus 200 shown in FIG. 2. However, the apparatus 400 may differ from the apparatus 200 in that the RRAM 402 in the apparatus 400 may include an additional RRAM bit cell 408. The additional RRAM bit cell 408 may include a transistor 404 and a resistive device 406, in which the transistor 404 is also connected to a column line 410. The resistive device 406 may be a non-memristor device or a memristor programmed to a specific resistance value. For instance, the resistive device 406 may be a poly-resistor, a laser-trimmed thin film resistor, a programmed memristor, a p-channel field-effect transistor (FET) with a gate voltage chosen for the FET to provide a desired current, or the like. In addition, in contrast to the resistor 204 in the RRAM 402, the resistive device 406 may not store a bit of an RRAM word. Instead, as discussed in detail below, a sense amplifier circuit 412 may detect the current flowing through the resistive device 406 to determine whether there is no hit, one hit, or multiple hits.

As shown in FIG. 4, the additional RRAM bit cells 408 in the multiple RRAMs 402-1 and 402-2 may be connected to a column line 410 and the sense amplifier circuit 412 may be connected to the column line 410. The sense amplifier circuit 412 may be a multi-level sense amplifier and may measure a current level on the column line 410. That is, as discussed herein, when there is a match between a search word 112 and the TCAM word stored in a TCAM 102-1, 102-2, a high voltage signal may be maintained across the match line 110. The high voltage signal may cause current to flow across the resistive device 406 from the top electrode 208 to the column line 410 and the sense amplifier circuit 412 may detect the current and output a signal, e.g., a "1", to signify a hit. Based on the measured current level, the sense amplifier circuit 412 may determine a hit count, e.g., the number of RRAMs 402-1, 402-2 that received a high voltage along the match line 110. For instance, based on the measured current level being at a first level, the sense amplifier circuit 412 may determine that there was a single hit. However, based on the measured current level being at a second level, the sense amplifier circuit 412 may determine that there was a double hit. In one regard, the sense amplifier circuit 412 may validate the output the RRAMs 402-1 and 402-2, e.g., may determine when multiple hits occur, which may be an indication that the output may not be valid.

Multiple hits may occur, for example, in instances in which all of the TCAM words are not uniquely defined across the TCAMs 310-1 to 310-P, multiple ones of the TCAMs 310-1 to 310-P may include TCAM words that match a search word 112. In these instances, a high voltage signal may be applied or maintained across multiple ones of the match lines 330-1 to 330-P, which may cause multiple ones of the RRAM words 322-1 to 332-P to be outputted. Thus, for instance, the sense amplifier circuit 412 may determine whether there is a single match, two matches, etc.

Accordingly, for instance, an outputted RRAM word 114 may be validated based on the determined number of hits. That is, an RRAM word 114 may be deemed to be valid in response to a determination that a single match has occurred, that an RRAM word 114 may be deemed to be invalid in response to a determination that more than one match has occurred, or that no hits or matches may be deemed to be an invalid data output. In addition, the hit count signal (the current flow on the column line 410) may linearly represent the actual number of hits in instances in which all of the resistors 406 in the RRAMs 320-1 to 320-P have the same resistance value with respect to each other. The hit count signal may alternatively represent a weighted sum of hits in instances in which the resistors 406 in the RRAMs 320-1 to 320-P have different values with respect to each other.

Figure 5:
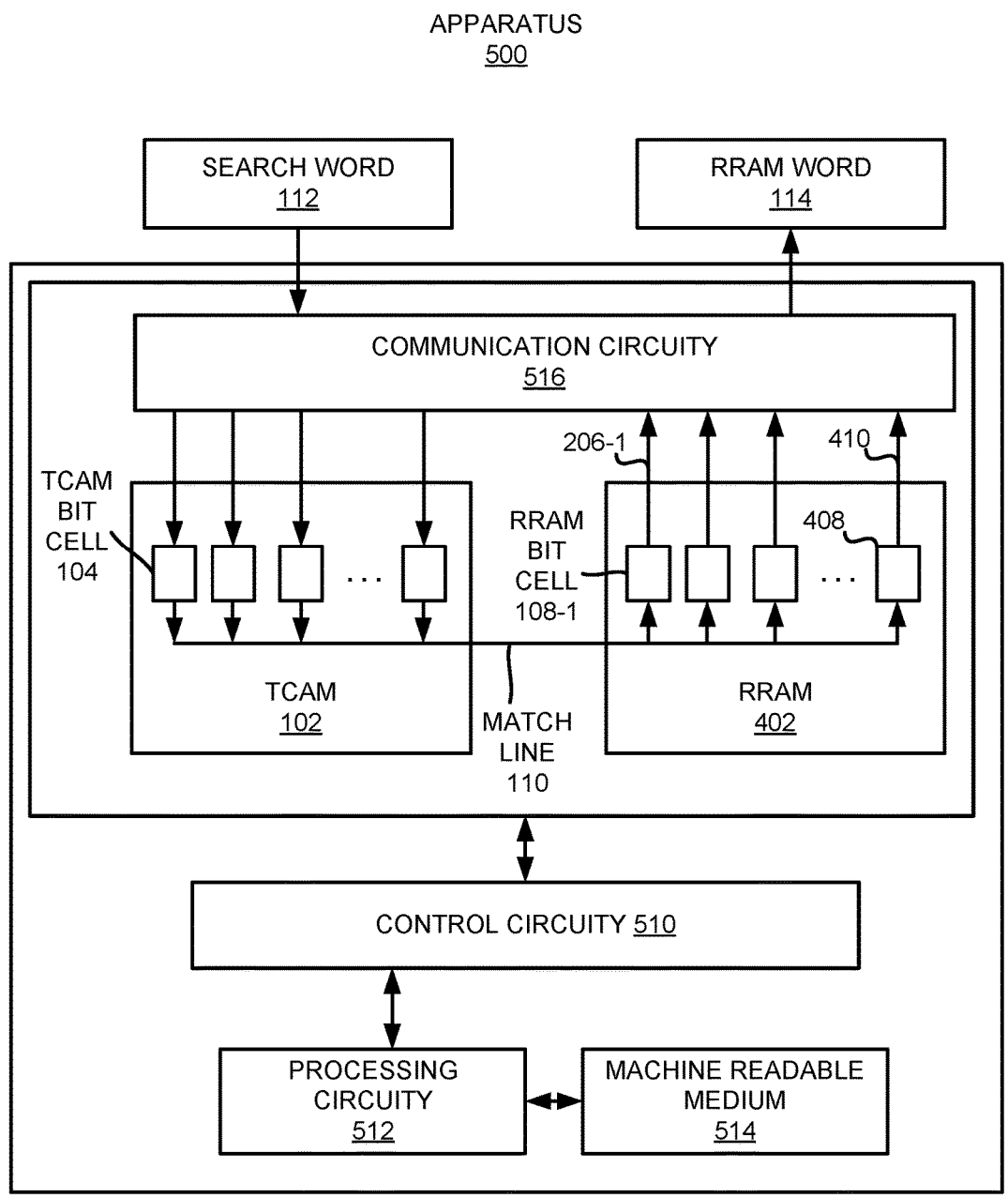
FIG. 5 shows a block diagram of an example apparatus that may include a TCAM, an RRAM, and control circuitry to search TCAM bit cells for a search word.

With reference now to FIG. 5, there is shown a block diagram of an example apparatus 500 that may include a TCAM 102, an RRAM 402, and control circuitry 510 to search TCAM bit cells 104 for a search word 112. It should be understood that the apparatus 500 depicted in FIG. 5 may include additional components and that some of the components described herein may be removed and/or modified without departing from a scope of the apparatus 500 disclosed herein.

The apparatus 500 may be connected to a processor or may include a processor having an integrated processing circuitry 512 and control circuitry 510. The processor may be a semiconductor-based microprocessor, a central processing unit (CPU), an application specific integrated circuit (ASIC), a field-programmable gate array (FPGA), and/or another hardware device. It should be understood that the apparatus 500 may include multiple processors, multiple cores, or the like, without departing from a scope of the apparatus 500. The apparatus 500 may also include a non-transitory machine readable medium 514 that may have stored thereon machine-readable instructions executable by the processor.

The apparatus 500 may include a TCAM 102, RRAM 402, processing circuitry 512, communications circuitry 516, control circuitry 510, and machine readable medium 514. The TCAM 102 may be an instance of the example TCAM 102 described herein with reference to FIGS. 1A-4, and may include an array of TCAM bit cells 104. The RRAM 402 may be an instance of the example RRAM 106 depicted in FIGS. 1A-3 or the example RRAM 402 depicted in FIG. 4 (as shown in FIG. 5) and may include an array of RRAM bit cells 108 and an additional RRAM bit cell 408. Although a single TCAM 102 and a single RRAM 402 are depicted in FIG. 5, the apparatus 500 may include multiple TCAMs 102 and multiple RRAMs 402 as described herein with respect to FIGS. 2-4. In other examples, the apparatus 500 may include the RRAM 102 depicted in FIGS. 1A-2.

The processing circuitry 512 may supply control signals to the control circuitry 510. The processing circuitry 512 may also supply the search word 112 received via the communication circuitry 516 and the address to the control circuitry 510. The processing circuitry 512 may be any circuitry that may execute machine-readable instructions, such as a central processing unit (CPU), a microprocessor, a microcontroller device, a digital signal processor (DSP), etc. The processing circuitry 512 may also be an application-specific integrated circuit (ASIC), a field-programmable gate array (FPGA), an application-specific instruction set processor (ASIP), or the like, that is configured to perform certain operations described herein, such as the read, write, and search operations. The machine readable medium 514 may be any non-transitory machine readable medium, which may include volatile storage media (e.g., DRAM, SRAM, etc.) and/or non-volatile storage media (e.g., PROM, EPROM, EEPROM, NVRAM, hard drives, optical disks, etc.). The machine readable medium 514 may store machine-readable instructions that, when executed by the processing circuitry 512, may cause the apparatus 500 to perform some or all of the operations described herein, such as the search operations.

The communications circuitry 516 may be circuitry for receiving input data communications and sending output data communications such as a search word 112 and an RRAM word 114. For example, the communications circuitry 516 may include a network interface card. In an example, the communications circuitry 516 may include multiple communications ports, and may serve to connect multiple other electronic devices to one another via the apparatus 500. For example, the apparatus 500 may be attached to or may be integrated into a network router for deep packet inspection. The architecture illustrated in FIG. 5 may operate at a high speed, with a RRAM word 114 responsive to a search word 112 being output in a single operation. In addition the layout of the apparatus 500 may be compact.

Figure 6:
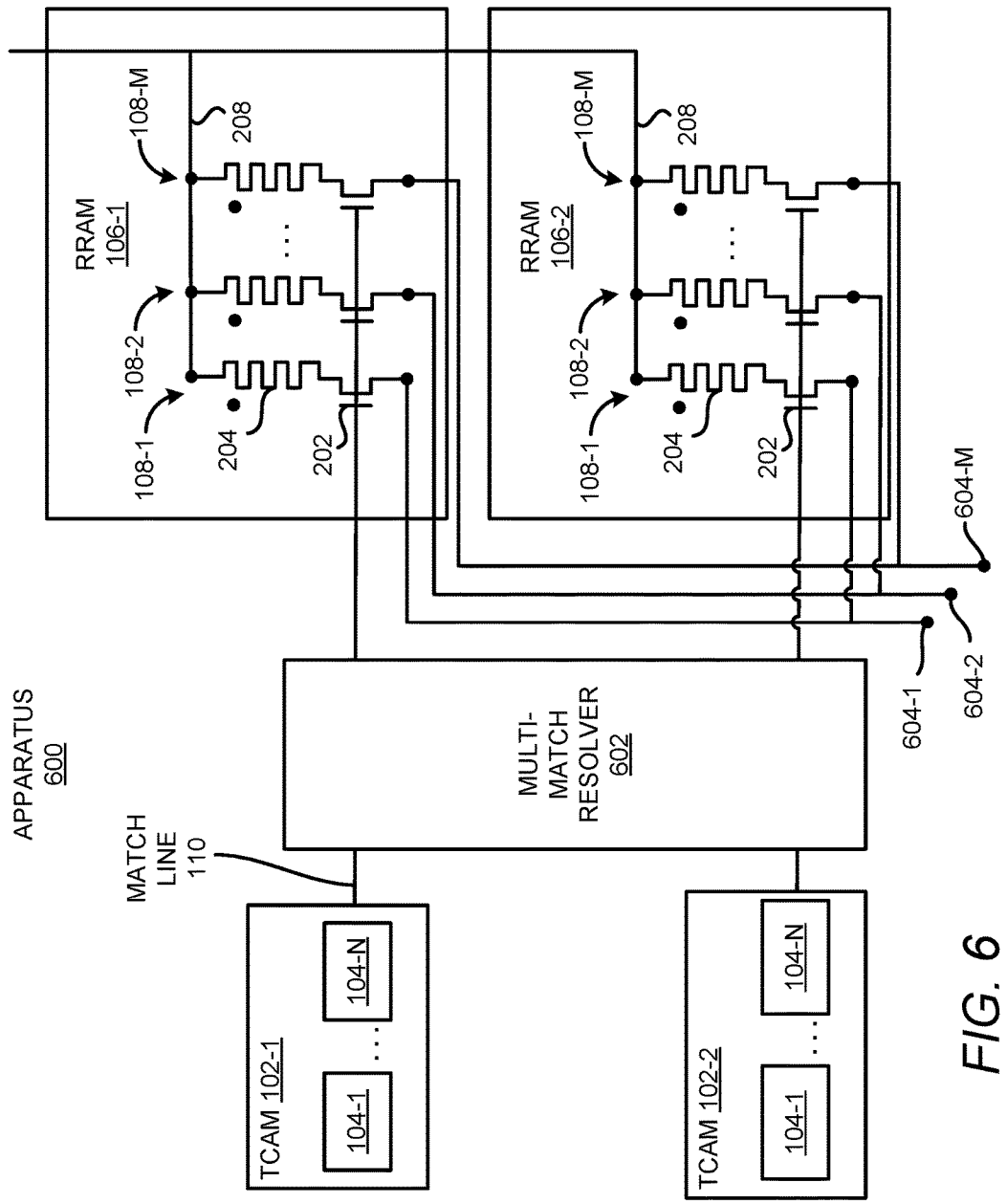
FIG. 6 shows a block diagram of an example apparatus that may include multiple TCAMs, multiple RRAMs, and a multiple match resolver.

Turning now to FIG. 6, there is shown a block diagram of an example apparatus 600 that may include multiple TCAMs 102, multiple RRAMs 106, and a multiple match resolver 602. It should be understood that the apparatus 600 may include additional components and that some of the components described herein may be removed and/or modified without departing from a scope of the apparatus 600. For instance, although the apparatus 600 is depicted as including two TCAMs 102-1, 102-2 and two RRAMs 106-1, 106-2, it should be understood that the apparatus 600 may include any number of TCAMs 102 and RRAMs 106 without departing from a scope of the apparatus 600.

As shown in FIG. 6, the apparatus 600 may include the same components as the apparatus 200 shown in FIG. 2. However, the apparatus 600 may differ from the apparatus 200 in that the apparatus 600 may include a multiple match resolver 602 interposed between the TCAMs 102 and the RRAMs 106. Particularly, the multiple match resolver 602 may intercept each of the match lines 110 from the TCAMs 102 and may receive signals driven by the TCAM bit cells 104-1 to 104-N over the match lines 110. The multiple match resolver 602 may be an n-bit input output datapath circuit, in which "n" is the number of match lines 110 in the TCAM array. For instance, assuming match/high=1 (logic convention) and the highest priority of the topmost row, the multiple match resolver 602 may be described logically by the following:

$Out_0 = In_0$
$Out_1 = In_1 \cdot \overline{In_0}$
. . .
$Out_n = In_n \cdot \overline{In_{n-1}} \cdot \ldots \cdot \overline{In_1} \cdot \overline{In_0}$ The multiple match resolver 602 may select the highest priority match line 110 among the match lines 110 through the above logic in that the resolved output bit for match line "n" is a "1" if (1) the corresponding input bit ($In_n$) is signaling a "1", and (2) all higher priority input bits ($In_m$ for all m<n) are zero. The multiple match resolver 602 may be implemented digitally in static CMOS, and may be implemented with stages of AND, OR and NOT logic gates. In addition, or alternatively, the multiple match resolver 602 may be implemented using dynamic circuits with pass transistor chains and wired-OR logic. As also shown in FIG. 6, each of the RRAM bit cells 108-1 to 108-M may be connected to a respective cycle lookup line 604-1 to 604-M.

In instances in which the multiple match resolver 602 receives signals over multiple ones of the match lines 110, the multiple match resolver 602 may select a highest priority match line 110 of the plurality of match lines on which the signals are driven. In addition, the multiple match resolver 602 may output the signal on the selected match line 610 while blocking the output of the signals on the non-selected match lines. In instances in which the multiple match resolver 602 receives a single signal over one of the match lines 110, the multiple match resolver 602 may output the signal over that match line 110. In this regard, the multiple match resolver 602 may output a single signal across a single match line 110 such that a single RRAM 106-1 to 106-M may output an RRAM word even in instances in which there are multiple TCAM hits. Multiple hits may occur, for example, in instances in which all of the TCAM words are not uniquely defined across the TCAMs 102-1, 102-2.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example of the disclosure along with some of its variations. The terms, descriptions and figures used herein are set forth by way of illustration only and are not meant as limitations. Many variations are possible within the spirit and scope of the disclosure, which is intended to be defined by the following claims—and their equivalents—in which all terms are meant in their broadest reasonable sense unless otherwise indicated.

What is claimed is:

1. An apparatus comprising:
   a ternary content addressable memory (TCAM) comprising a plurality of TCAM bit cells connected in a row along a match line, wherein each of the TCAM bit cells stores a bit of a TCAM word, and wherein the TCAM bit cells are to drive a digital signal over the match line in response to a search word matching the TCAM word; and
   a resistive random-access memory (RRAM) comprising a row of RRAM bit cells connected to the TCAM via the match line, wherein each of the RRAM bit cells stores a bit of a RRAM word, and wherein the RRAM bit cells are to output the RRAM word in response to the TCAM bit cells driving the digital signal over the match line.

2. The apparatus of claim 1, wherein each of the RRAM bit cells comprises a one-transistor one-resistor bit cell.

3. The apparatus of claim 2, wherein the resistors in the RRAM bit cells are memristors.

4. The apparatus of claim 3, further comprising:
   a sense amplifier circuit to:
   detect a current level across a resistor;
   convert the detected current level into one of a first value or a second value; and
   output the first value or the second value.

5. The apparatus of claim 1, wherein the RRAM includes an additional bit cell that does not store a bit of the RRAM word and wherein current is to flow through the additional bit cell in response to the TCAM bit cells driving the digital signal over the match line.

6. The apparatus of claim 5, wherein the additional bit cell includes a transistor and a resistive device, wherein the resistive device is one of a non-memristor device or a memristor programmed to a specific resistance.

7. The apparatus of claim 1, further comprising:
   a plurality of the TCAMs; and
   a plurality of the RRAMs, wherein the RRAM bit cells in each of the plurality of RRAMs is connected to a respective TCAM via respective match lines.

8. The apparatus of claim 7, wherein the TCAM bit cells in each of the plurality of TCAMs stores a different TCAM word.

9. The apparatus of claim 7, further comprising:
   a multiple match resolver interposed between the plurality of TCAMs and the plurality of RRAMs, wherein the multiple match resolver is used to:
   receive signals driven by the TCAM bit cells in the TCAMs over a plurality of the match lines;
   select a highest priority match line of the plurality of match lines on which signals are driven; and
   output the signal on the selected match line to the RRAM connected to the selected match line.

10. The apparatus of claim 1, wherein each of the TCAM bit cells includes:
    a first memristor;
    a second memristor connected to the first memristor via a node; and
    a match line transistor connected between a first rail and the match line, wherein a gate of the match line transistor is connected to the node.

11. An apparatus comprising:
    a first ternary content addressable memory (TCAM) corresponding to a first TCAM word;
    a first resistive random-access memory (RRAM), the first RRAM having a plurality of RRAM bit cells including memristors; and
    a first match line connecting the first TCAM to the first RRAM,
    wherein the first TCAM is to drive a digital signal over the first match line signal in response to a search word matching the first TCAM word and wherein the first RRAM is to output a first RRAM word in response to the first TCAM driving the digital signal over the first match line.

12. The apparatus of claim 11, further comprising:
    a second TCAM corresponding to a second TCAM word;
    a second RRAM having a plurality of RRAM bit cells including memristors; and
    a second match line connecting the second TCAM to the second RRAM,
    wherein the second TCAM is to drive a digital signal over the second match line in response to a search word matching the second TCAM word and wherein the second RRAM is to output a second RRAM word in response to the second TCAM driving the digital signal over the second match line.

13. The apparatus of claim 12, further comprising:
a first column line connected to a first RRAM bit cell in the first RRAM and to a first RRAM bit cell in the second RRAM;
a second column line connected to a second RRAM bit cell in the first RRAM and to a second RRAM bit cell in the second RRAM;
a first sense amplifier circuit to detect a current level along the first column line; and
a second sense amplifier circuit to detect a current level along the second column line.

14. The apparatus of claim 13, wherein the first sense amplifier is to output a first value or a second value corresponding to the detected current level along the first column line and the second sense amplifier is to output the first value or the second value corresponding to the detected current level along the second column line.

15. The apparatus of claim 10, wherein the first RRAM includes an additional RRAM bit cell comprising a resistive device, wherein the resistive device is one of a non-memristor device or a memristor programmed to a specific resistance.

16. The apparatus of claim 10, wherein the first TCAM comprises a plurality of TCAM bit cells connected to the first match line, wherein each of the TCAM bit cells stores a bit of the first TCAM word, wherein the first match line is to be driven in response to each of the TCAM bit cells indicating a match.

17. An electronic device comprising:
a ternary content addressable memory (TCAM) comprising a plurality of TCAM bit cells connected in a row along a match line, wherein each of the TCAM bit cells stores a bit of a TCAM word;
a resistive random-access memory (RRAM) comprising a row of RRAM bit cells connected to the TCAM via the match line and wherein each of the RRAM bit cells stores a bit of a RRAM word; and
a control circuit to search the TCAM bit cells for a search word, wherein the TCAM bit cells are to drive a digital signal over the match line in response to a search word matching the TCAM word, and wherein the RRAM bit cells are to output the RRAM word in response to the TCAM bit cells driving the digital signal over the match line.

18. The electronic device of claim 17, further comprising:
a plurality of the TCAMs, each of the TCAMs comprising TCAM bit cells that store a different TCAM word; and
a plurality of the RRAMs, wherein the RRAM bit cells in each of the plurality of RRAMs is connected to a respective TCAM, wherein the control circuit is to search each of the plurality of TCAMs for the search word.

19. The electronic device of claim 17, wherein each of the RRAM bit cells comprises a one-transistor one-resistor bit cell and wherein the resistors in the RRAM bit cells are memristors.

20. The electronic device of claim 17, wherein the RRAM includes an additional bit cell that does not store a bit of the RRAM word.

* * * * *